US011115772B2

(12) United States Patent
Yasuda

(10) Patent No.: US 11,115,772 B2
(45) Date of Patent: Sep. 7, 2021

(54) COMPUTER-READABLE NON-TRANSITORY STORAGE MEDIUM HAVING STORED THEREIN SOUND PROCESSING PROGRAM, INFORMATION PROCESSING APPARATUS, SOUND PROCESSING METHOD, AND INFORMATION PROCESSING SYSTEM

(71) Applicant: NINTENDO CO., LTD., Kyoto (JP)

(72) Inventor: Takuro Yasuda, Kyoto (JP)

(73) Assignee: NINTENDO CO., LTD., Kyoto (JP)

( * ) Notice: Subject to any disclaimer, the term of this patent is extended or adjusted under 35 U.S.C. 154(b) by 0 days.

(21) Appl. No.: 16/592,987

(22) Filed: Oct. 4, 2019

(65) Prior Publication Data

US 2020/0162832 A1 May 21, 2020

(30) Foreign Application Priority Data

Nov. 21, 2018 (JP) ............................ JP2018-218377

(51) Int. Cl.
*H04R 5/02* (2006.01)
*H03G 3/20* (2006.01)
*H04S 7/00* (2006.01)

(52) U.S. Cl.
CPC ........... *H04S 7/303* (2013.01); *H04S 2400/11* (2013.01); *H04S 2400/13* (2013.01)

(58) Field of Classification Search
CPC .. H04S 2420/01; H04S 2400/11; H04S 7/302; H04S 2400/13; H04S 7/30; H04S 7/305; H04S 7/307; G10H 2210/291; G10H 2220/401; G06F 3/011; H04R 2400/11
USPC .... 381/306, 310, 63, 98, 103, 104, 105, 107
See application file for complete search history.

(56) References Cited

U.S. PATENT DOCUMENTS

| | | | | |
|---|---|---|---|---|
| 2008/0144794 A1* | 6/2008 | Gardner | H04M 3/568 | 379/202.01 |
| 2014/0133681 A1 | 5/2014 | Mizuta | | |
| 2015/0264502 A1* | 9/2015 | Aoki | H04S 7/307 | 381/17 |
| 2017/0238119 A1* | 8/2017 | Schlecht | H04S 7/305 | 381/303 |

FOREIGN PATENT DOCUMENTS

| | | |
|---|---|---|
| JP | 2014-094160 | 5/2014 |

* cited by examiner

*Primary Examiner* — George C Monikang
(74) *Attorney, Agent, or Firm* — Nixon & Vanderhye, P.C.

(57) ABSTRACT

An exemplary embodiment includes: disposing at least one virtual sound source in a virtual space; calculating a parameter relevant to a sound volume on the basis of a distance from a first reference in the virtual space to the virtual sound source; calculating a parameter relevant to a sound quality on the basis of a distance from a second reference in the virtual space to the virtual sound source, the second reference being different from the first reference; and outputting, with a sound volume based on the parameter relevant to the sound volume and a sound quality based on the parameter relevant to the sound quality, a sound associated with the virtual sound source.

22 Claims, 16 Drawing Sheets

FIG. 8
FIG. 9
SOUND VOLUME
0khz
300Hz
2Khz
FREQUENCY
SOUND VOLUME
0khz
300Hz
2Khz
FREQUENCY

VIRTUAL SPACE COORDINATE SYSTEM

COMPUTER-READABLE NON-TRANSITORY STORAGE MEDIUM HAVING STORED THEREIN SOUND PROCESSING PROGRAM, INFORMATION PROCESSING APPARATUS, SOUND PROCESSING METHOD, AND INFORMATION PROCESSING SYSTEM

CROSS REFERENCE TO RELATED APPLICATION

The disclosure of Japanese Patent Application No. 2018-218377, filed on Nov. 21, 2018, is incorporated herein by reference.

FIELD

The exemplary embodiments relate to sound control processing.

BACKGROUND AND SUMMARY

Conventionally, technology for controlling a sound volume on the basis of the distance between a virtual sound source and a virtual microphone is known.

However, the above technology involves nothing about a sound quality.

Therefore, an object of the exemplary embodiments is to provide a computer-readable non-transitory storage medium having stored therein a sound processing program, an information processing apparatus, a sound processing method, and an information processing system that enable unprecedented and new sound processing in which a sound volume and a sound quality are controlled independently of each other in sound control based on the distance from a virtual sound source.

Configuration examples for achieving the above object will be shown below.

One configuration example is a computer-readable non-transitory storage medium having stored therein a sound processing program causing a computer of an information processing apparatus to: dispose at least one virtual sound source in a virtual space; calculate a parameter relevant to a sound volume on the basis of a distance from a first reference in the virtual space to the virtual sound source; calculate a parameter relevant to a sound quality on the basis of a distance from a second reference in the virtual space to the virtual sound source, the second reference being different from the first reference; and output, with a sound volume based on the parameter relevant to the sound volume and a sound quality based on the parameter relevant to the sound quality, a sound associated with the virtual sound source. As used herein, the term "computer-readable non-transitory storage medium" includes a flash memory, a magnetic medium such as ROM or RAM, an optical medium such as CD-ROM, DVD-ROM, or DVD-RAM, for example.

According to the above configuration example, since different references are used for the processing for a sound volume and the processing for a sound quality. Thus, it becomes possible to produce a sound expression for which "the part to which it is desired to cause a player to pay attention through representation independently of a sound volume" is taken into consideration.

In another configuration example, the first reference may be a line segment defined in the virtual space, and the second reference may be a point defined in the virtual space.

According to the above configuration example, in game processing in which an image is displayed in a third-person view, or the like, it is possible to reduce a feeling of strangeness given to a player, in particular, regarding the sound volume of a sound source present on the near side with respect to the position of the player object.

In another configuration example, the second reference may be located at one end of the line segment.

In another configuration example, the first reference may be a first point set in the virtual space, and the second reference may be a second point set at a position different from the first point in the virtual space.

According to the above configuration example, since the first point and the second point are set at different positions, the sound quality can be controlled independently of the sound volume, whereby it becomes possible to produce a sound expression for which the part to which it is desired to cause a player to pay attention through representation is taken into consideration.

In another configuration example, the sound processing program may further cause the computer to: control a virtual camera in the virtual space; and move each of positions of the first reference and the second reference in accordance with movement of the virtual camera.

According to the above configuration example, since the first reference and the second reference are moved in accordance with movement of the virtual camera, it becomes possible to produce an appropriate sound representation in accordance with the position of the player object.

In another configuration example, the second reference may be set at a position of a gaze point of the virtual camera.

According to the above configuration example, the position to which it is desired to cause a player to pay attention by an image, and the position to which it is desired to cause a player to pay attention by sound, can be caused to coincide with each other.

In another configuration example, the parameter relevant to the sound volume may be calculated such that, the shorter the distance from the first reference to the virtual sound source is, the greater the sound volume is, and the longer the distance is, the smaller the sound volume is.

According to the above configuration example, it is possible to reduce a feeling of strangeness in an expression relevant to a sound volume.

In another configuration example, the parameter relevant to the sound quality may be a parameter indicating a degree of change of a frequency characteristic.

According to the above configuration example, it is possible to change a frequency characteristic of a sound of the sound source on the basis of the distance from the second reference to the virtual sound source.

In another configuration example, the parameter indicating the degree of change of the frequency characteristic may be a parameter for reducing a specific frequency component, and is calculated such that, the shorter the distance from the second reference to the virtual sound source is, the smaller a degree of the reduction is, and the longer the distance from the second reference to the virtual sound source is, the greater the degree of the reduction is.

According to the above configuration example, the sound quality can be effectively changed by changing only a specific frequency component, and the attention degree of a player can be changed through control of the sound quality.

In another configuration example, the parameter relevant to the sound quality may be a parameter relevant to a reverberation effect.

According to the above configuration example, it is possible to change the reverberation effect of a sound of the virtual sound source on the basis of the distance from the second reference to the virtual sound source.

In another configuration example, the parameter relevant to the reverberation effect may be calculated such that, the shorter the distance from the second reference to the virtual sound source is, the greater a time lag between a direct sound and an indirect sound is, and the longer the distance is, the smaller the time lag is.

According to the above configuration example, it is possible to change the attention degree of a player through control of the sound quality, while expressing a reverberation effect with a less feeling of strangeness.

According to the exemplary embodiments, since different references are used for the processing for a sound volume and the processing for a sound quality, it is possible to change the attention degree of a player to a sound, independently of the sound volume.

DETAILED DESCRIPTION OF NON-LIMITING EXAMPLE EMBODIMENTS

Hereinafter, an exemplary embodiment will be described. It is to be understood that as used herein, elements and the like written in a singular form with a word "a" or "an" attached before them do not exclude those in a plural form.

Figure 1:
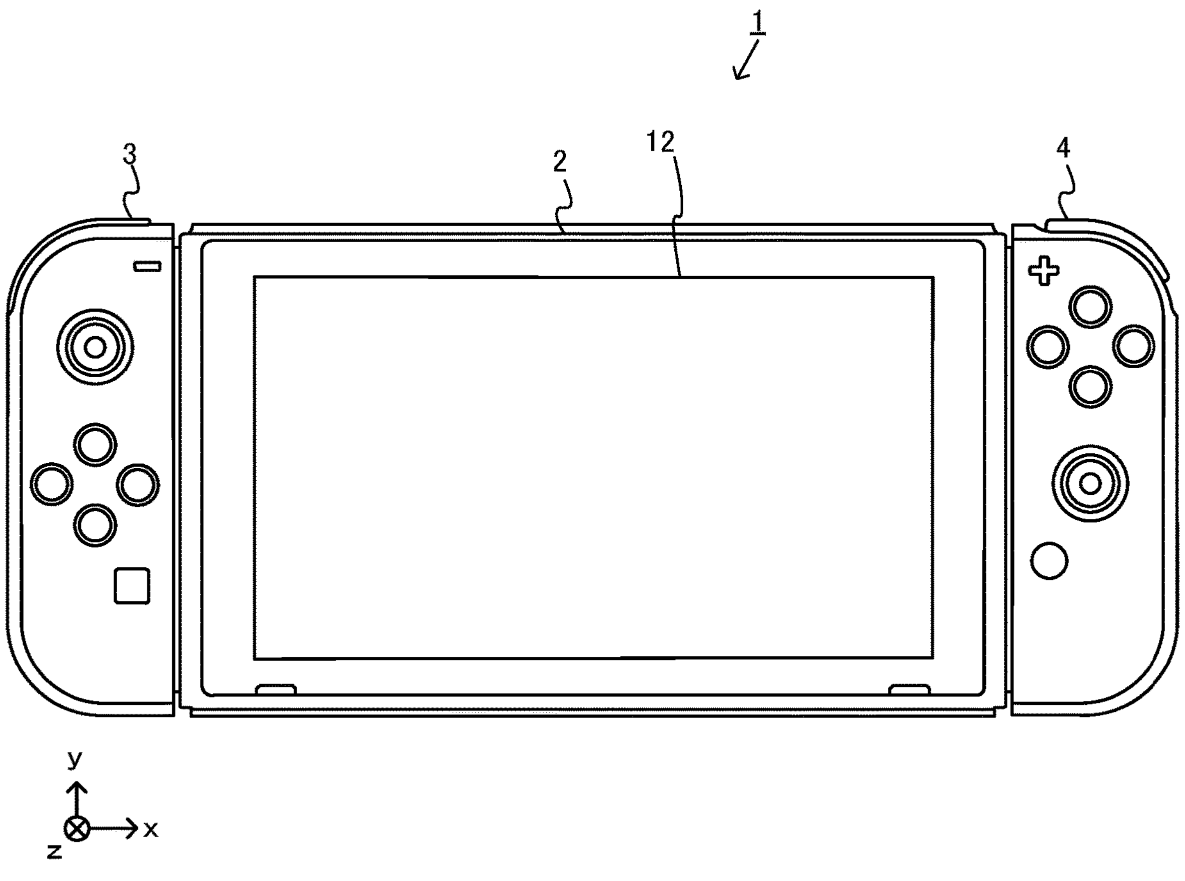
FIG. 1 is a view showing a non-limiting example of a state in which a left controller 3 and a right controller 4 are attached to a body apparatus 2.

First, an information processing system for executing information processing according to the exemplary embodiment will be described. In the exemplary embodiment, a game system will be described as an example of the information processing system. Although any game system may be employed, FIG. 1 shows, as an example, an external view of a game system used in the exemplary embodiment. A game system 1 shown in FIG. 1 includes a main body apparatus (an information processing apparatus; which functions as a game apparatus main body in the exemplary embodiment) 2, a left controller 3, and a right controller 4. Each of the left controller 3 and the right controller 4 is attachable to and detachable from the main body apparatus 2. That is, the game system 1 can be used as a unified apparatus obtained by attaching each of the left controller 3 and the right controller 4 to the main body apparatus 2. Further, in the game system 1, the main body apparatus 2, the left controller 3, and the right controller 4 can also be used as separate bodies. FIG. 1 shows an example of a state in which the left controller 3 and the right controller 4 are attached to the body apparatus 2. As shown in FIG. 1, the left controller 3 and the right controller 4 are attached to the body apparatus 2 so as to be unified. The body apparatus 2 is an apparatus that executes various types of processing (e.g., game processing) in the game system 1. The body apparatus 2 is provided with a display 12. The left controller 3 and the right controller 4 are devices having operation portions for a player to perform an input.

Figure 2:
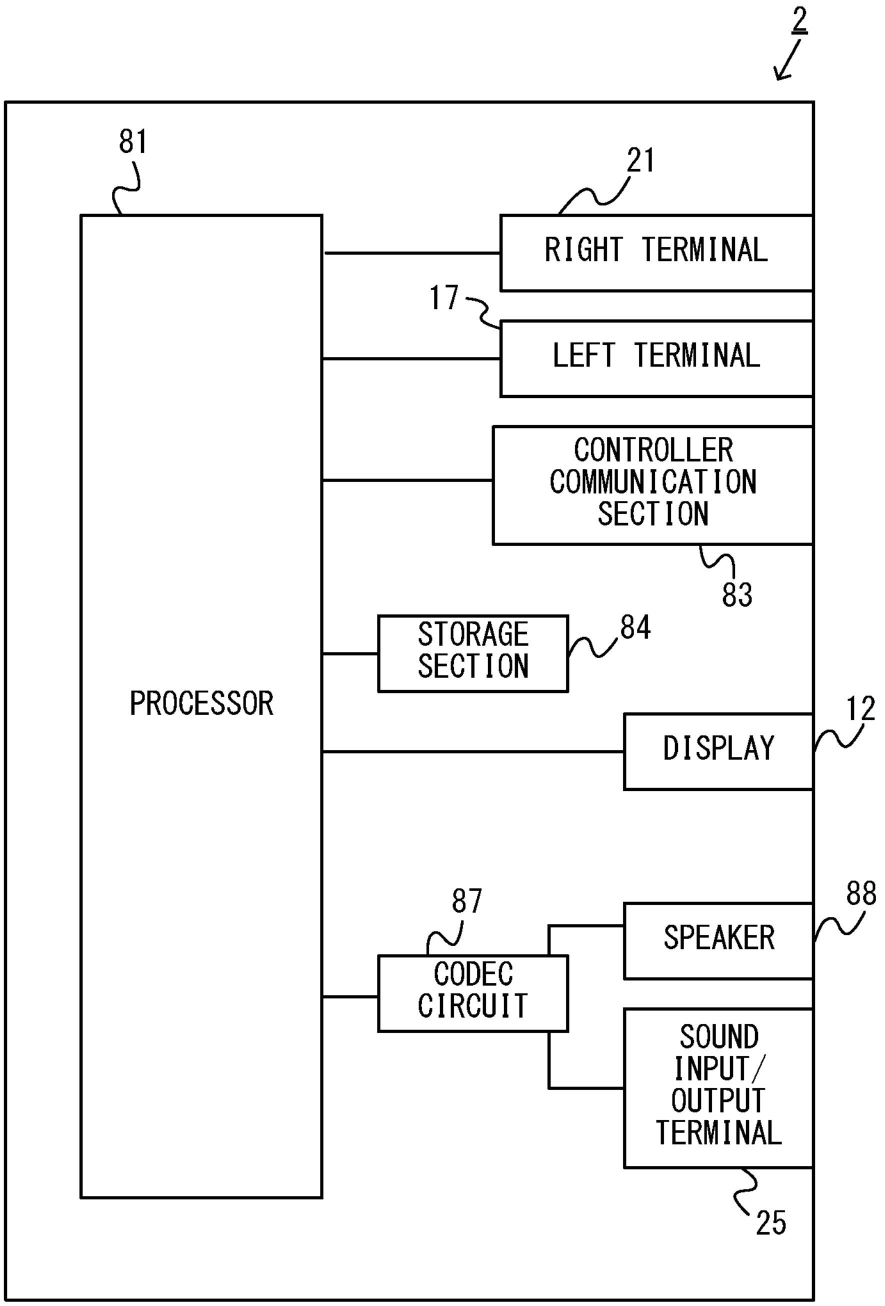
FIG. 2 is a block diagram showing a non-limiting example of the internal configuration of the body apparatus 2.

FIG. 2 is a block diagram showing an example of the internal configuration of the body apparatus 2. The main body apparatus 2 includes a processor 81. The processor 81 is an information processing section for executing various types of information processing to be executed by the main body apparatus 2. For example, the processor 81 may be composed only of a CPU (Central Processing Unit), or may be composed of a SoC (System-on-a-chip) having a plurality of functions such as a CPU function and a GPU (Graphics Processing Unit) function. The processor 81 executes an information processing program (e.g., a game program) stored in a storage section 84, thereby performing the various types of information processing. The storage section 84 may be an internal storage medium such as a flash memory or a dynamic random access memory (DRAM), or may be realized using, for example, an external storage medium mounted to a slot (not shown).

The main body apparatus 2 includes a controller communication section 83. The controller communication section 83 is connected to the processor 81. The controller communication section 83 wirelessly communicates with the left controller 3 and/or the right controller 4, when the body apparatus 2, and the left controller 3 and right controller 4, are used separately from each other. The communication method between the main body apparatus 2, and the left controller 3 and the right controller 4, is optional. In the exemplary embodiment, the controller communication section 83 performs communication compliant with the Bluetooth (registered trademark) standard with the left controller 3 and with the right controller 4.

Further, the main body apparatus 2 includes a left terminal 17, which is a terminal for the main body apparatus 2 to perform wired communication with the left controller 3, and a right terminal 21, which is a terminal for the main body apparatus 2 to perform wired communication with the right controller 4.

Further, the display 12 is connected to the processor 81. The processor 81 displays a generated image (e.g., an image generated by executing the above information processing) and/or an externally acquired image on the display 12.

The main body apparatus 2 includes a codec circuit 87 and speakers (specifically, a left speaker and a right speaker) 88. The codec circuit 87 is connected to the speakers 88 and a sound input/output terminal 25 and also connected to the processor 81. The codec circuit 87 is a circuit for controlling the input and output of sound data to and from the speakers 88 and the sound input/output terminal 25.

Although not shown, an image or a sound generated in the body apparatus 2 can be outputted to an external monitor or an external speaker via a predetermined output terminal.

[Controller]

Although not shown, the left controller 3 and the right controller 4 each include a communication control section for performing communication with the body apparatus 2. In a state in which the left controller 3 and the right controller 4 are attached to the body apparatus 2, the wired communication can be performed via the left terminal 17 and the right terminal 21. On the other hand, in the case where the body apparatus 2, and the left controller 3 and the right controller 4, are used separately from each other, it is possible to perform wireless communication with the body apparatus 2 not via the terminals. The communication control section acquires information about an input (specifically, information about an operation) from each of input portions of the controllers. Then, the communication control section transmits operation data including the acquired information (or information obtained by performing predetermined processing on the acquired information), to the body apparatus 2. It is noted that the operation data is repeatedly transmitted at intervals of once every predetermined time. It is noted that the intervals at which the information about an input is transmitted to the body apparatus 2 may be the same among the input portions, or may be different thereamong.

[Summary of Sound Control Processing According to First Exemplary Embodiment]

Next, the summary of operation of processing executed by a game system according to the first exemplary embodiment will be described. The processing assumed in the exemplary embodiment mainly involves sound control. Specifically, processing of controlling the attention degree for a sound.

Figure 3:
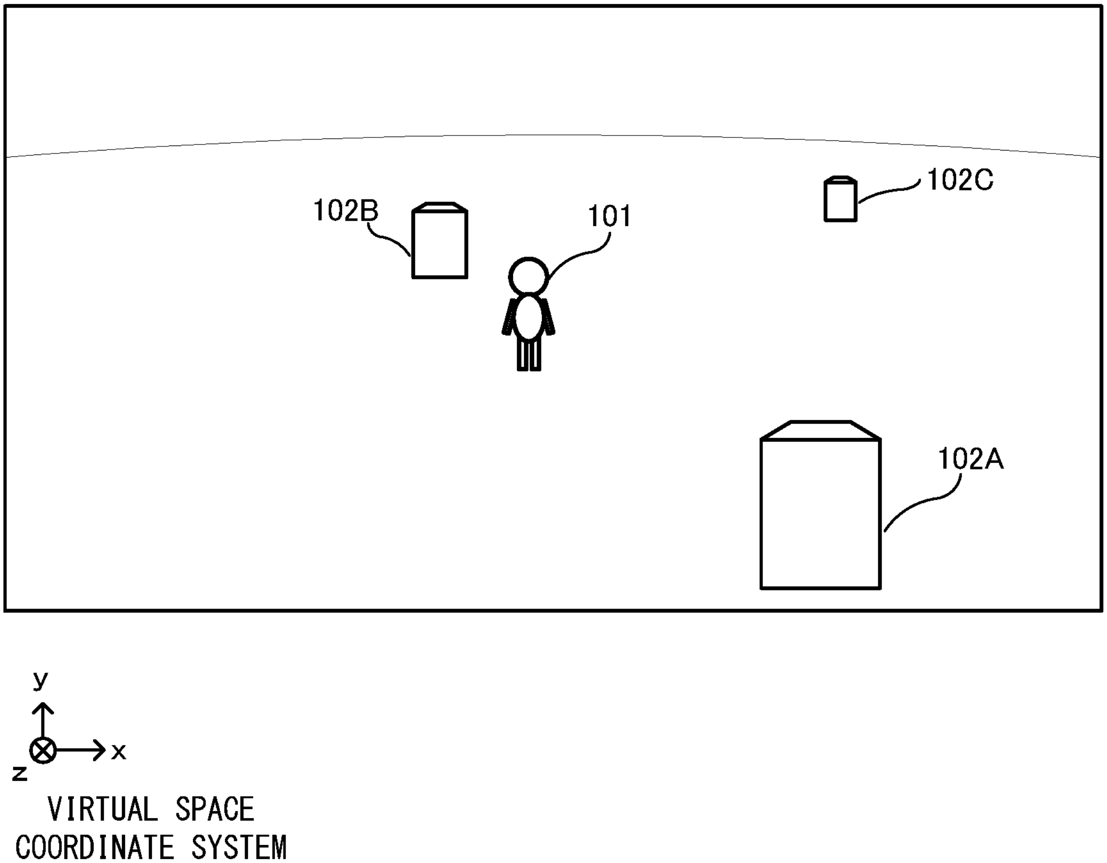
FIG. 3 shows a non-limiting example of a game screen according to an exemplary embodiment.
Figure 4:
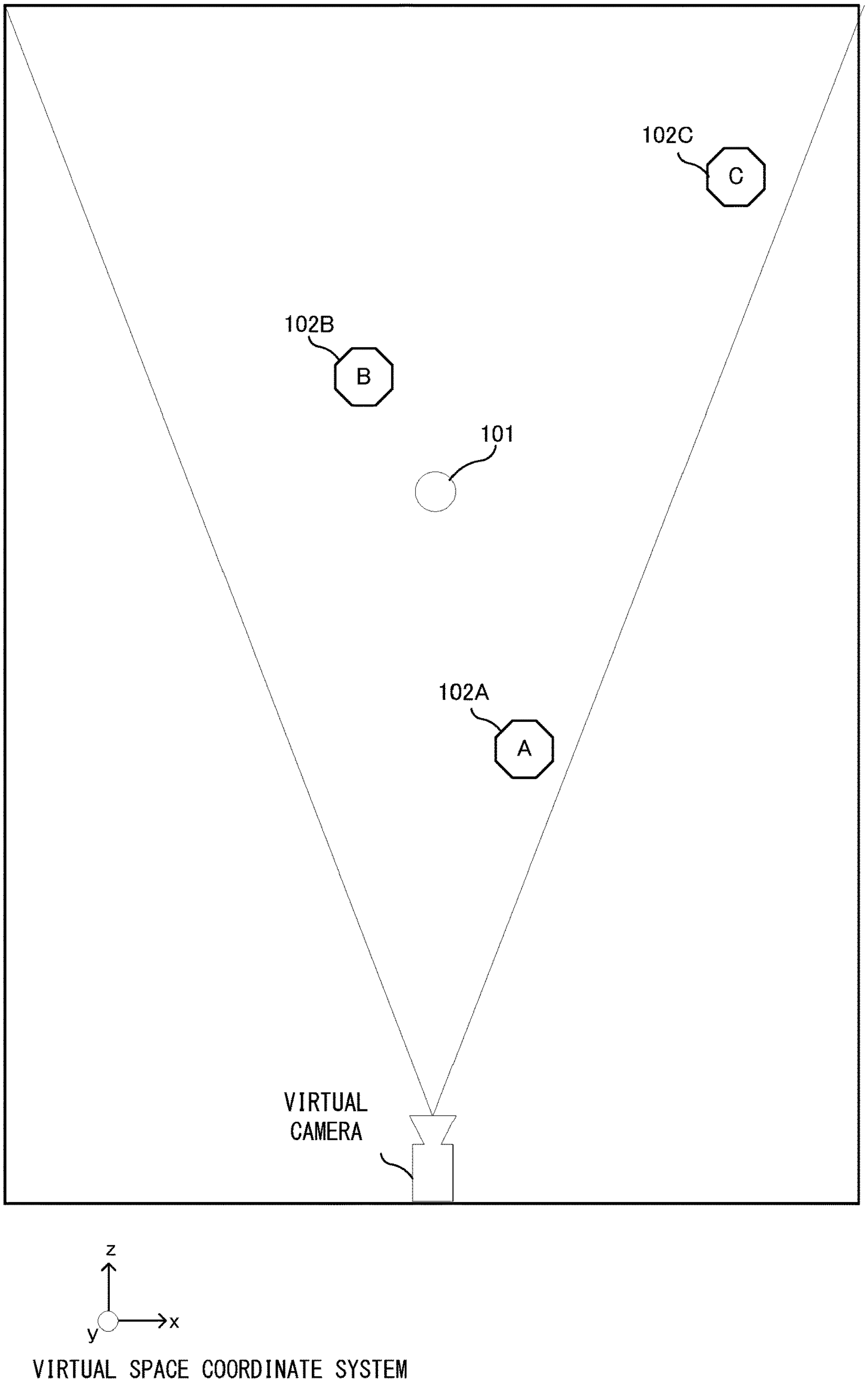
FIG. 4 shows a non-limiting example of a schematic overhead view of the scene shown in FIG. 3.

FIG. 3 shows an example of a game screen according to the first exemplary embodiment. In the present exemplary embodiment, an image obtained by taking a virtual three-dimensional space (hereinafter, simply referred to as virtual space) with a virtual camera is displayed as a game image. In the present exemplary embodiment, the game image is displayed in a third-person view, as an example. In FIG. 3, a player object 101 is displayed substantially at the center of the screen. In the present exemplary embodiment, the gaze point of the virtual camera is set at the position of the player object 101. When the player object 101 moves in the virtual space, the position of the virtual camera is moved so that the player object keeps being displayed substantially at the center of the screen. In the game image shown in FIG. 3, sound source objects 102A, 102B, 102C are also displayed. FIG. 4 shows a schematic overhead view of the virtual space, for the purpose of clarifying the positional relationship among the virtual camera, the player object 101, and the sound source objects 102 in the state shown in FIG. 3. In FIG. 4, the sound source object 102A is present at a right position on a near side with respect to the player object 101, as seen from the virtual camera. In addition, the sound source object 102B is present at a left position on a deep side with respect to the player object 101. In addition, the sound source object 102C is displayed at a right position on a further deep side with respect to the player object 101. These sound source objects 102 are objects that produce predetermined sounds in the virtual space. In the present exemplary embodiment, the sound source objects 102 are assumed to produce sounds having different contents. Hereinafter, with the above positional relationship as a premise, the sound control processing will be described.

In the sound control processing according to the present exemplary embodiment, processing relevant to a sound volume and processing relevant to a sound quality are performed on the basis of the distance between a "reference" described later and each sound source object 102. In the present exemplary embodiment, a sound volume refers to the magnitude of a sound. A sound quality refers to clarity of the sound (ease of listening). In the present exemplary embodiment, the processing relevant to a sound volume and the processing relevant to a sound quality use respective different references. Hereinafter, the reason why the two different references are used, and the principle of the processing according to the present exemplary embodiment, will be described.

First, as means for changing the player's attention degree for a sound, changing the sound volume is conceivable, that is, it is conceivable that raising the sound volume enhances the attention degree for the sound. In addition, it is considered that changing the sound quality is also effective for changing the attention degree for the sound. For example, it is considered that a sound having a high sound quality (clear sound) provides a higher attention degree than a sound having a low sound quality (unclear sound). Here, in calculation for the degrees of changes for the sound volume and the sound quality, if the degrees of changes of the sound volume and the sound quality are both calculated in accordance with the distance from the position of the virtual camera to the sound source object, the attention degree for the sound coincides with the magnitude of the sound volume after all. That is, in this case, the sound volume and the sound quality are both calculated using the "position of the virtual camera" as a reference. For example, as the distance to a sound source decreases, the sound volume increases and the sound quality also increases, and as the distance to a sound source increases, the sound volume decreases and the sound quality also decreases. As a result, a sound source having a large sound volume simply provides a high attention degree. In other words, the attention point based on the sound volume and the attention point based on the sound quality coincide with each other.

In the state in which the attention point based on the sound volume and the attention point based on the sound quality coincide with each other as described above, the attention degree for the sound coincides with the magnitude of the sound volume after all. Considering this, in the processing according to the present exemplary embodiment, different references are used for calculation of the degree of change for the sound volume and calculation of the degree of change for the sound quality. Thus, it becomes possible to make an expression in which, although the sound volume is great, the sound quality is low, so that the attention degree for the sound is low, or although the sound volume is small, the sound quality is high, so that the attention degree for the sound is high. For example, in the case where a sound source is displayed in large size near the virtual camera but the sound thereof is of low importance in terms of game representation, the sound quality therefor may be decreased, whereby an out-of-focus sound expression can be made. On the other hand, in the case where a sound source is far from the virtual camera but is just beside the player object 101 and it is desired to cause the player to pay attention to the sound thereof, the sound quality therefor may be relatively enhanced, whereby the attention degree therefor can be increased. In other words, it is possible to make an expression for which the part to which it is desired to cause a player to pay attention through representation independently of the sound volume is taken into consideration.

Figure 5:
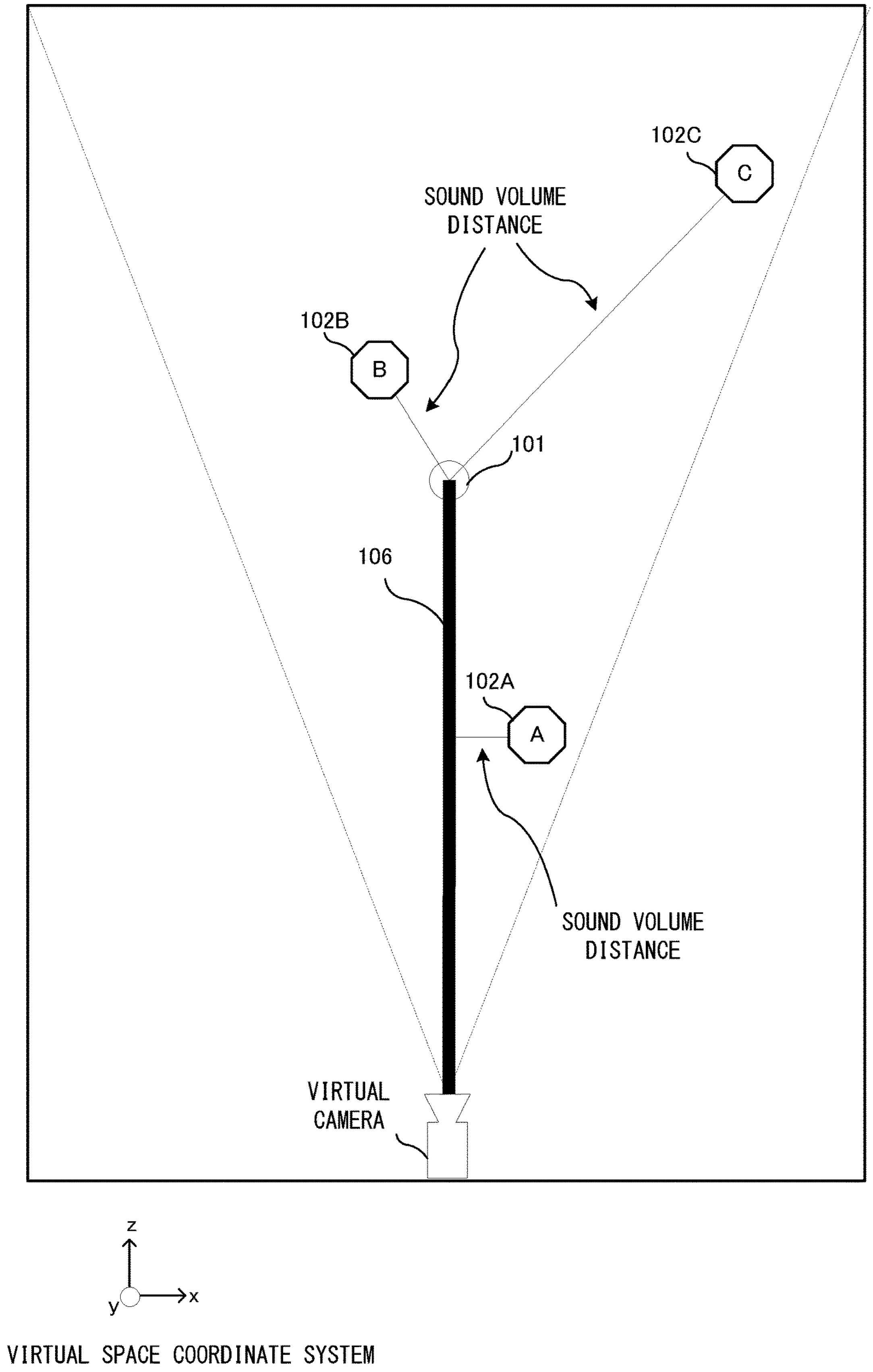
FIG. 5 illustrates a non-limiting example of a reference for a sound volume.
Figure 6:
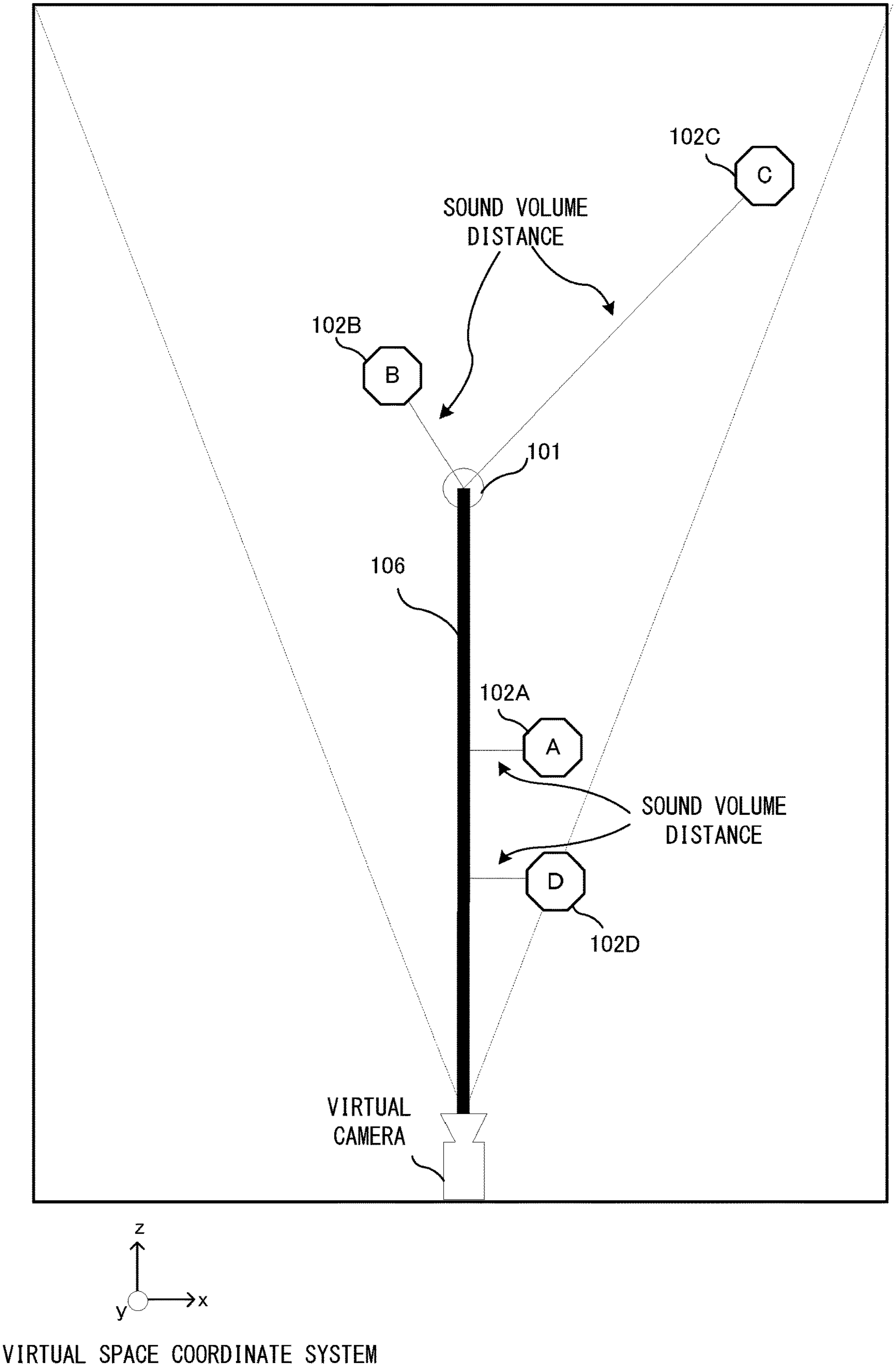
FIG. 6 illustrates a non-limiting example of a reference for a sound volume.
Figure 7:
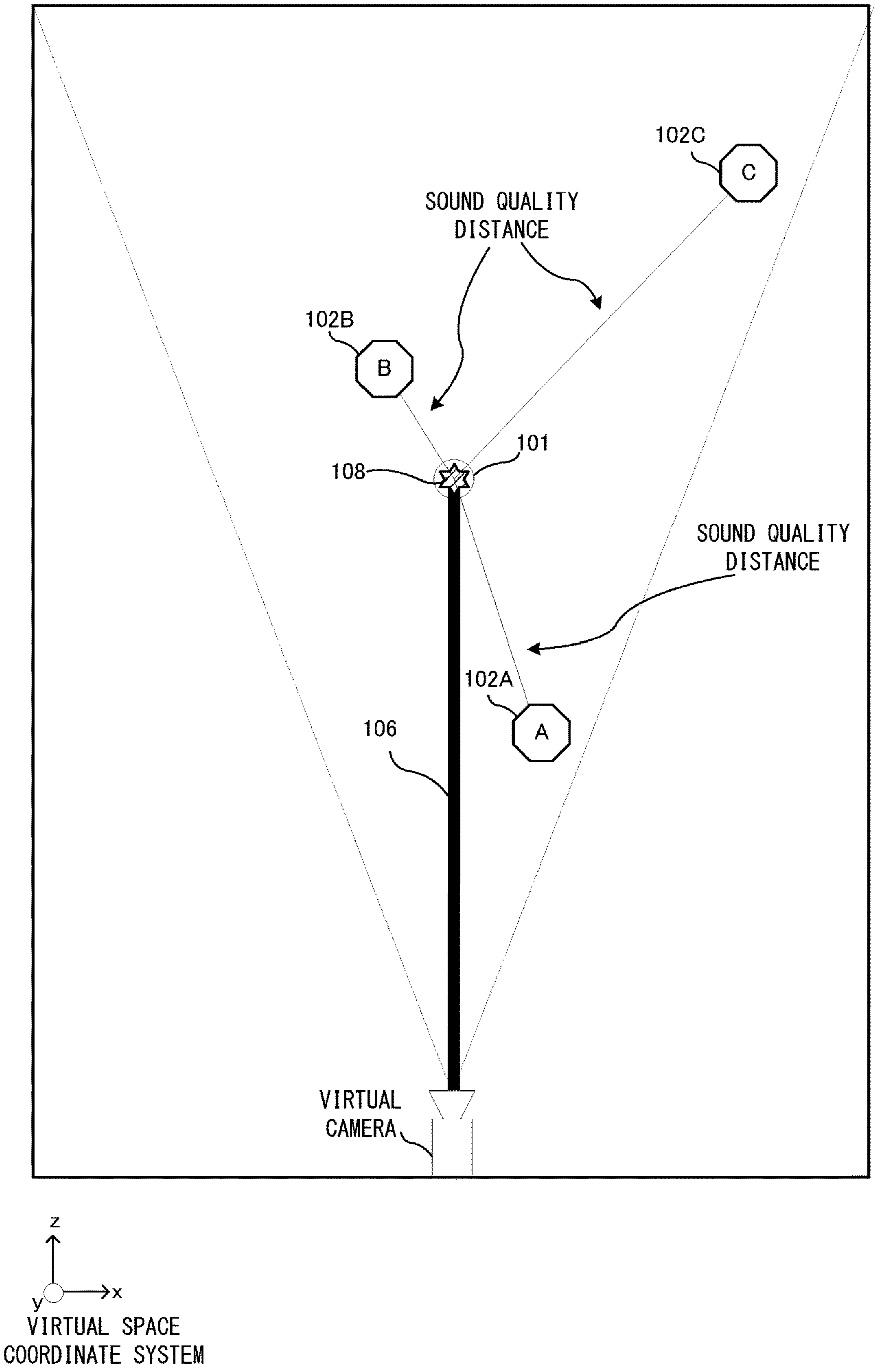
FIG. 7 illustrates a non-limiting example of a reference for a sound quality.

Next, the principle of the processing according to the present exemplary embodiment will be more specifically described with reference to FIG. 5 to FIG. 7.

[Reference for Sound Volume]

First, the reference for a sound volume will be described with reference to FIG. 5 and FIG. 6. In general, it is considered that the magnitude of the sound volume is proportional to the distance from a predetermined reference position that is a sound reception point (sound listening position), e.g., the position of the virtual camera (virtual microphone), to a sound source. In this regard, in the present exemplary embodiment, a line segment 106 as shown in FIG. 5 is used as a reference for calculating the distance to a sound source object. Hereinafter, the line segment is referred to as "sound volume reference line". In the present exemplary embodiment, the sound volume reference line 106 is defined as a line segment connecting the virtual camera and the gaze point (position of player object 101). In the present exemplary embodiment, a parameter (hereinafter, referred to as sound volume parameter) relevant to the sound volume for each sound source object 102 is calculated on the basis of the direct distance along the shortest distance between the sound source object 102 and the sound volume reference line 106. In the example shown in FIG. 5, comparing the direct distance that is the shortest distance between each sound source object 102 and the sound volume reference line 106 (hereinafter, this distance is referred to as sound volume distance), the sound volume distance to the sound source object 102A is the shortest, the sound volume distance to the sound source object 102B is longer than this, and the sound volume distance to the sound source object 102C is the longest. Therefore, the sound volume parameters are calculated such that the sound volume for the sound source object 102A is the greatest. For example, in the case where the sound volume is represented in 10-level scale from 1 to 10 (the smaller the value is, the smaller the sound volume is), the sound volume parameters are calculated such that the sound volume for the sound source object 102A is 2, the sound volume for the sound source object 102B is 3, and the sound volume for the sound source object 102C is 8.

Since the sound volume parameters are calculated on the basis of the shortest distances from the sound volume reference line 106, the sound volume parameters indicating the same sound volume can be calculated irrespective of the distance from the virtual camera as long as the above shortest distances are the same. For example, as shown in FIG. 6, it is assumed that a sound source object 102D is present. The x and y coordinates of the position of the sound source object 102D are the same as those of the sound source object 102A, and only the z coordinate thereof is closer to the virtual camera. That is, in terms of the distance from the virtual camera, the sound source object 102D is closer to the virtual camera than the sound source object 102A is. However, in terms of the shortest distance from the sound volume reference line 106, both objects are at the same sound volume distance. Therefore, in this case, the same sound volume is calculated for the sound source objects 102A and 102D.

In this way, by calculating the sound volumes using the line segment, it is possible to produce a sound expression with a less feeling of strangeness to a player in the case of displaying a game image in a third-person view in which the player object is displayed as shown in FIG. 3. For example, if the sound volumes for a plurality of sound source objects present between the position of the virtual camera and the position of the player object are set to equal levels, a feeling of strangeness given to a player is reduced.

[Reference for Sound Quality]

Next, the reference for a sound quality will be described. FIG. 7 illustrates the reference for a sound quality. In the present exemplary embodiment, a line segment referred to as "sound volume reference line" described above is used for a sound volume, whereas a reference referred to as sound quality reference point 108 as shown in FIG. 7 is used for a sound quality. That is, conceptually, a sound reception point in the processing for a sound volume and a sound reception point in the processing for a sound quality are set to be different from each other. The sound quality reference point 108 is defined in the virtual space. In the present exemplary embodiment, the sound quality reference point 108 is set at the same position as the gaze point (consequently, overlaps the position of the player object 101, in the present exemplary embodiment). As a result, the sound quality reference point 108 is set at the same position as one end of the sound volume reference line 106.

In the present exemplary embodiment, a parameter (hereinafter, referred to as sound quality parameter) relevant to a sound quality for each sound source object is calculated on the basis of the direct distance that is the shortest distance between the sound quality reference point and each sound source object. In the example shown in FIG. 7, comparing the direct distance that is the shortest distance between each sound source object 102 and the sound quality reference point 108 (hereinafter, this distance is referred to as sound quality distance), the sound quality distance to the sound source object 102B is the shortest. That is, in terms of the sound volume distance, the sound source object A is a sound source object present at the shortest distance, but in terms of the sound quality distance, the sound source object B is a sound source object present at the shortest distance. In this case, in the present exemplary embodiment, the sound quality parameters of the sound source objects 102 are calculated such that the attention degree for the sound of the sound source object 102B is higher than that for the sound source object 102A. Specifically, the sound quality parameters are calculated such that the sound quality for the sound source object 102A is lower than the sound quality for the sound source object 102B. Thus, the attention degree of the player to the sound source object 102B for which the sound quality is relatively high can be increased.

Here, the details of the sound quality parameter in the present exemplary embodiment will be specifically described. In the present exemplary embodiment, as an example of processing for changing a sound quality, "processing of changing a frequency characteristic" and "processing of changing reverberation" are performed.

[Changing of Frequency Characteristic]

Figure 8:
FIG. 8 illustrates a non-limiting example of change of a frequency characteristic.
Figure 9:
FIG. 9 illustrates a non-limiting example of change of a frequency characteristic.

First, the concept of the processing of changing a frequency characteristic will be described. FIG. 8 shows a (original) frequency spectrum of a certain sound. In FIG. 8, the vertical axis indicates the sound volume, and the horizontal axis indicates the frequency. FIG. 9 shows a frequency spectrum after the frequency characteristic of the sound is changed. As indicated in parts enclosed by dotted lines in FIG. 9, sound volumes for a frequency component of 300 Hz and a frequency component of 2 kHz (to be exact, components in frequency bands centered on these frequency components) are reduced from those in FIG. 8, thereby changing the frequency characteristic of the sound. In the present exemplary embodiment, the reduction amount (change amount) is calculated on the basis of the sound quality distance. Specifically, the reduction amount is calculated to be greater as the sound quality distance becomes longer. In the following description, the value indicating the reduction amount is referred to as "frequency characteristic parameter".

In the example shown in FIG. 8 and FIG. 9, the case of reducing the frequency components of 300 Hz and 2 kHz is shown. However, this is merely an example, and specific frequency components to be reduced are not limited thereto. The above example is merely an example indicating that, for the sound exemplified in FIG. 8, clarity of the sound can be effectively adjusted by reducing the above frequency components. In the processing in the present exemplary embodiment, frequency components for which sound volumes are to be changed are 300 Hz and 2 kHz uniformly among all the sound source objects. In another exemplary embodiment, frequency components to be reduced may be different among the sound source objects, for example. That is, such frequency components that allow change in the sound quality to be effectively exhibited may be changed, in accordance with the content of a sound to be produced by each sound source object.

In the present exemplary embodiment, it is assumed that changing of the frequency characteristic includes only "reduction" of a frequency component from the original sound produced from the sound source as a default. That is, in this processing, increase of the frequency component from the default value is not performed. Also in this regard, in another exemplary embodiment, processing of increasing the frequency component may be performed as well as processing of decreasing the frequency component.

[Changing of Reverberation]

Next, the concept of the processing of changing reverberation will be described. In the present exemplary embodiment, the magnitude of the time lag between a direct sound and an indirect sound (also called reflected sound) is changed, thereby changing the attention degree of the player to the sound. The time lag is changed in accordance with, for example, the distance between a sound reception point and a sound source. For example, the time lag between a direct sound and an indirect sound differs between reverberation in the case where the sound reception point is close to the sound source and reverberation in the case where the sound reception point is far from the sound source. In the following description, the former reverberation is referred to as "short-distance reverberation", and the latter reverberation is referred to as "long-distance reverberation".

Figure 10:
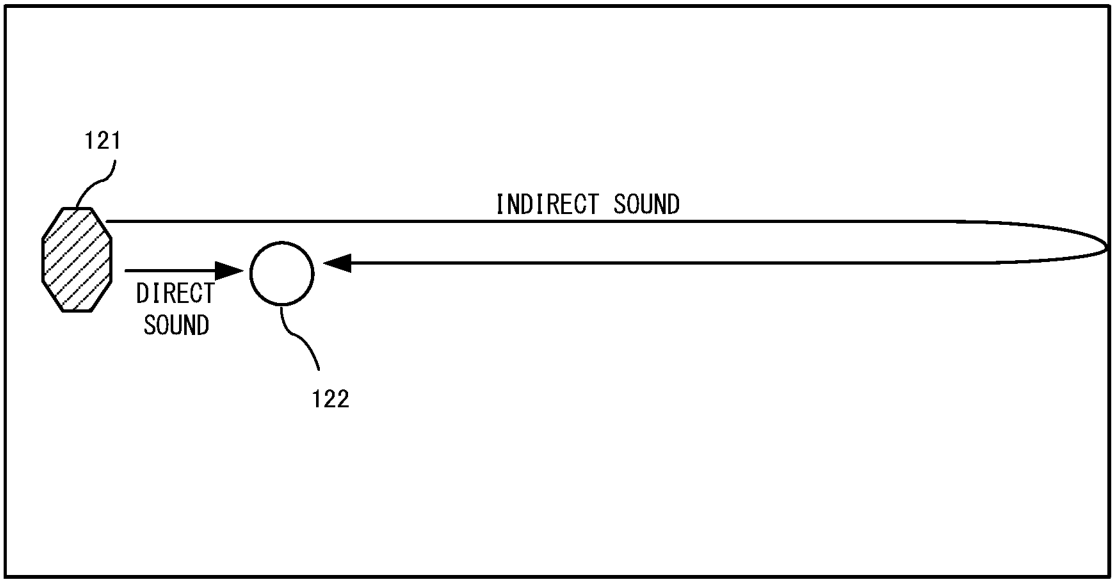
FIG. 10 illustrates a non-limiting example of short-distance reverberation.
Figure 11:
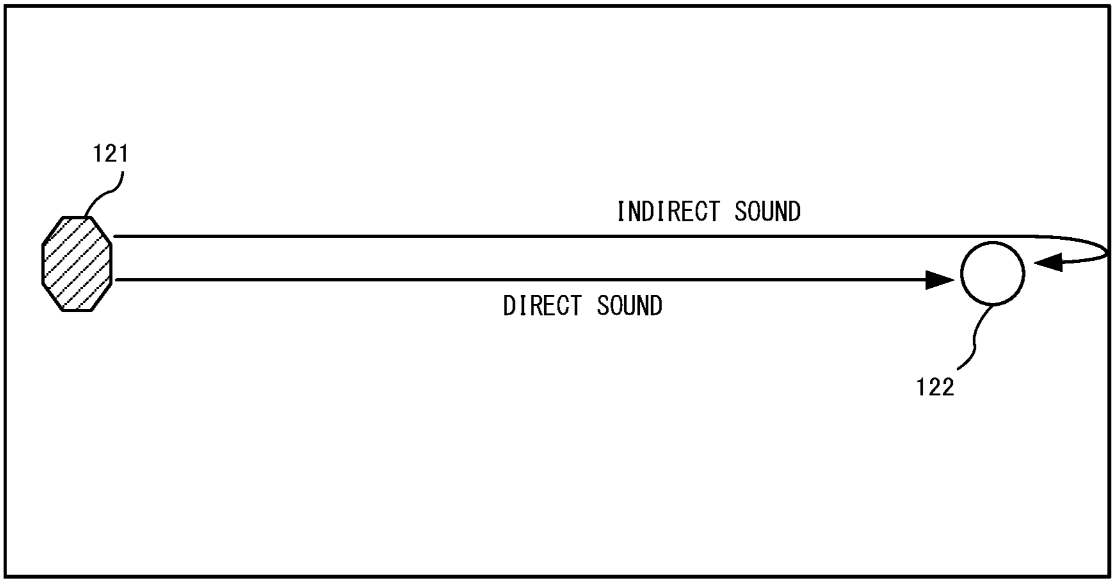
FIG. 11 illustrates a non-limiting example of long-distance reverberation.
Figure 12:
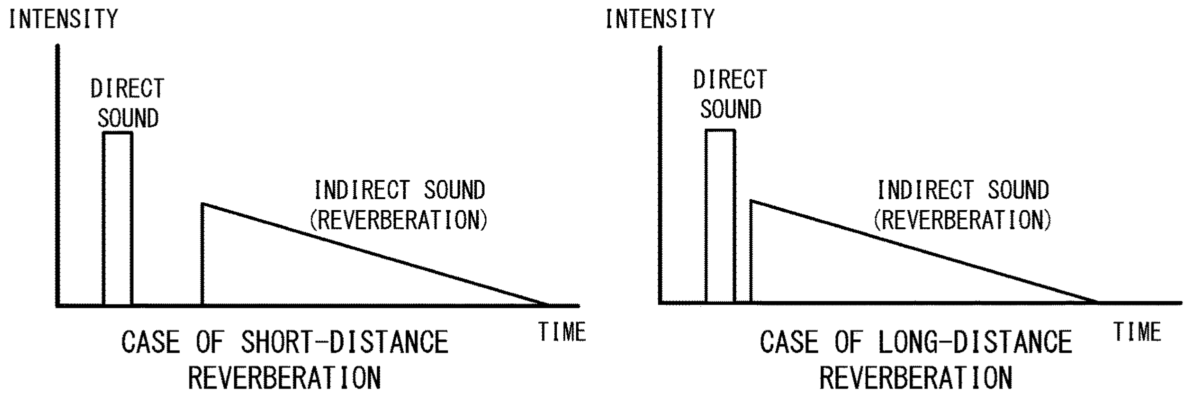
FIG. 12 illustrates a non-limiting example of a reverberation effect.

Here, supplementary description for the concepts of the "short-distance reverberation" and the "long-distance reverberation" will be given with reference to the drawings. FIG. 10 is a schematic diagram showing the concept of short-distance reverberation in the present exemplary embodiment. In FIG. 10, as an example, a space surrounded by walls on four sides is viewed from above, and a sound source 121 and a sound reception point 122 are present in the space. In FIG. 10, the sound source 121 is located near the left end in the drawing, and the sound reception point 122 is located just at the right thereof. In such a positional relationship, the direct sound produced from the sound source directly reaches the sound reception point. On the other hand, as for the indirect sound, in the example shown in FIG. 10, the indirect sound once reaches the right end wall in the drawing, and then is reflected to reach the sound reception point 122. Therefore, it is considered that the difference between the time until the direct sound reaches the sound reception point 122 and the time until the indirect sound reaches the sound reception point 122 is great. FIG. 11 is a schematic diagram showing the concept of the long-distance reverberation in the present exemplary embodiment. In FIG. 11, as compared to FIG. 10 above, the sound reception point 122 is located near the right end wall in the drawing. That is, the distance between the sound source 121 and the sound reception point 122 is longer than that in FIG. 10. In such a case, it is considered that the difference between the time until the direct sound reaches the sound reception point 122 and the time until the indirect sound reflected by the right end wall reaches the sound reception point 122 is smaller than that in the case shown in FIG. 10. Accordingly, in the present exemplary embodiment, the time lag between the direct sound and the indirect sound in short-distance reverberation is set to be greater than the time lag in long-distance reverberation. FIG. 12 shows examples of the time lag in short-distance reverberation and the time lag in long-distance reverberation. In FIG. 12, the left graph shows an example of short-distance reverberation, and the right graph shows an example of long-distance reverberation. In the graphs, the vertical axis indicates the intensity of a sound, and the horizontal axis indicates time. As shown in FIG. 12, the time lag between a direct sound and an indirect sound in short-distance reverberation is greater than the time lag in long-distance reverberation.

In the processing according to the present exemplary embodiment, an indirect sound (hereinafter, referred to as short-distance reverberation sound) intended for short-distance reverberation and an indirect sound (hereinafter, referred to as long-distance reverberation sound) intended for long-distance reverberation as described above, are generated, and these indirect sounds are combined with the direct sound, thereby generating a sound to be outputted. In the generation of the indirect sounds, the sound volume in short-distance reverberation and the sound volume in long-distance reverberation are changed in accordance with the sound quality distance. For example, in the case where the sound quality distance is short, the sound volume for short-distance reverberation is made greater than the sound volume for long-distance reverberation. Specifically, the allocation ratio between a sound volume to be used for processing for short-distance reverberation and a sound volume to be used for processing for long-distance reverberation is calculated, and a short-distance reverberation sound and a long-distance reverberation sound are generated in accordance with the allocated sound volumes.

Figure 13:
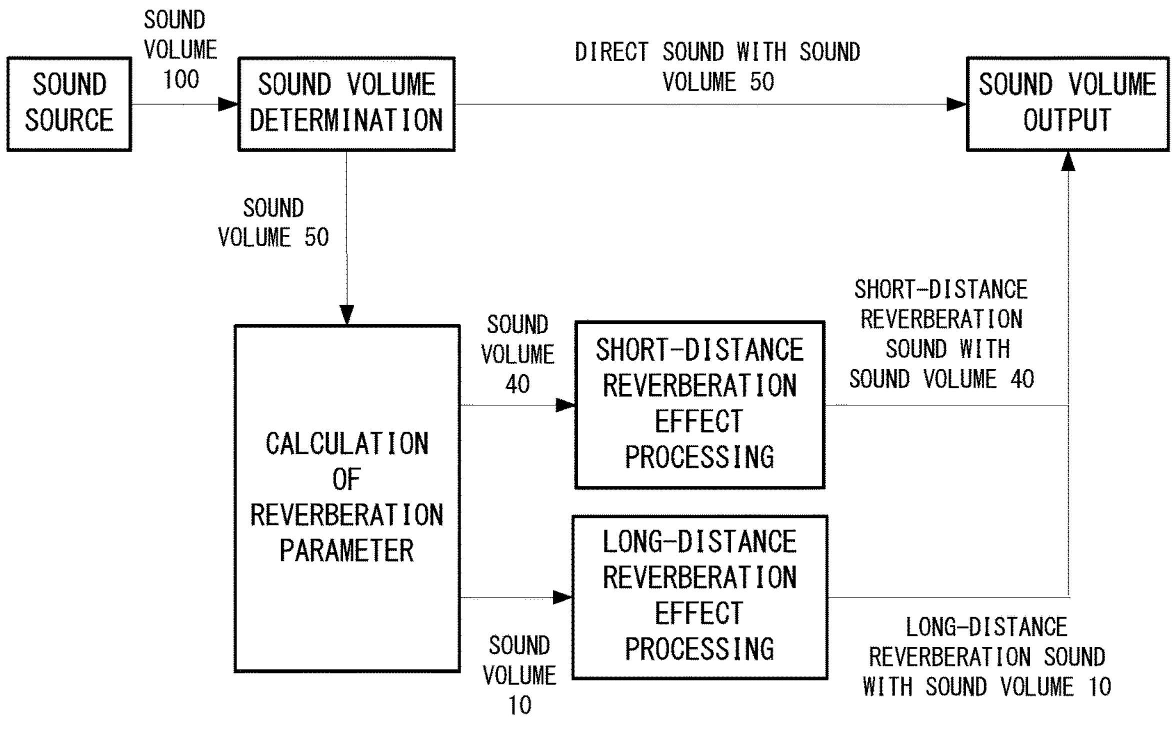
FIG. 13 illustrates a non-limiting example of the summary of processing for the reverberation effect.
Figure 14:
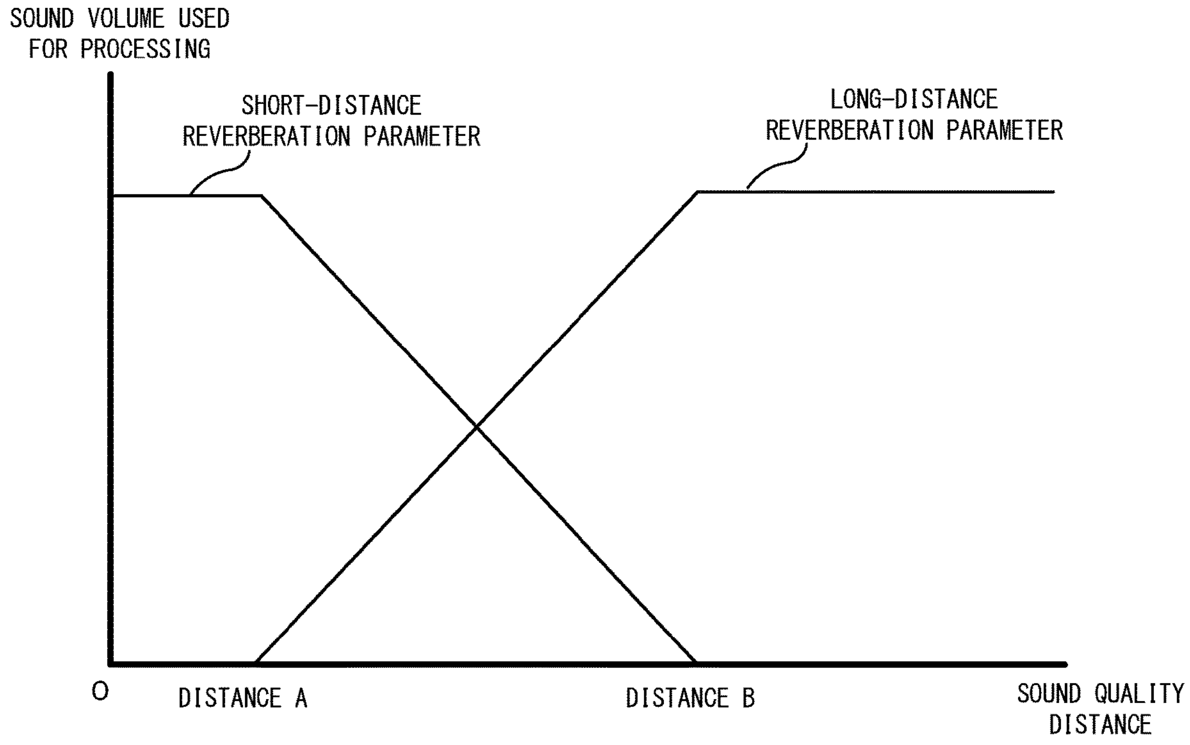
FIG. 14 shows a non-limiting example of the relationship between a sound volume and a sound quality distance, for a short-distance reverberation parameter and a long-distance reverberation parameter.

Here, with reference to FIG. 13, supplementary description will be given regarding the processing for reverberation in the present exemplary embodiment. FIG. 13 is a processing block diagram showing how the sound volume of a sound produced from a sound source is allocated to a direct sound and an indirect sound in the processing. In FIG. 13, it is assumed that a sound with a sound volume 100 is produced from the sound source. In response to this, first, processing of determining the sound volume of a sound to be outputted on the basis of the sound volume distance is performed. Here, it is assumed that the sound volume is determined to be 50. Therefore, a direct sound with a sound volume 50 is to be outputted. Further, using the determined sound volume 50, processing of generating an indirect sound is executed. That is, processing of generating reverberation of the direct sound with the sound volume 50 is executed. As described above, in the present exemplary embodiment, processing of generating an indirect sound for short-distance reverberation and processing of generating an indirect sound for long-distance reverberation, are executed. Prior to these processes, the ratio of sound volumes to be allocated for both processes is determined. In the following description, a value indicating a sound volume to be allocated for the processing for short-distance reverberation is referred to as "short-distance reverberation parameter". In addition, a value indicating a sound volume to be allocated for the processing for long-distance reverberation is referred to as "long-distance reverberation parameter". Both parameters may be correctively referred to as "reverberation parameters". The reverberation parameters are determined in accordance with the sound quality distance. For example, the reverberation parameters are calculated so as to satisfy a relationship in a graph shown in FIG. 14. FIG. 14 is a graph showing the relationship between a sound volume and a sound quality distance, for each of the short-distance reverberation parameter and the long-distance reverberation parameter. As shown in FIG. 14, in a range where the sound quality distance is 0 to A, the ratio of the short-distance reverberation parameter for the sound volume to be used for the processing is 100%, and from distance A to distance B, the ratio of the short-distance reverberation parameter is gradually decreased while the ratio of the long-distance reverberation parameter is gradually increased. Then, in a range exceeding the distance B, the ratio of the long-distance reverberation parameter is 100%. In the present exemplary embodiment, the reverberation parameters are calculated in accordance with the sound quality distance so as to satisfy the relationship shown in this graph, as an example.

Returning to FIG. 13, it is assumed that, as a result of the calculation of the reverberation parameters, a sound volume 40 is allocated for the processing for short-distance reverberation effect and a sound volume 10 is allocated for the processing for long-distance reverberation effect, for example. As a result, a short-distance reverberation sound having a sound volume of 40 and a long-distance reverberation sound having a sound volume of 10 are outputted to be combined with the direct sound of the sound volume 50, whereby the sound signal to be outputted is generated.

In the generation for the indirect sound intended for short-distance reverberation, processing of adding an appropriate acoustic effect so that the sound is heard like short-distance reverberation may be performed as necessary, besides setting of the time lag. Similarly, also in the generation for the indirect sound intended for long-distance reverberation, processing of adding an appropriate acoustic effect may be performed as necessary.

As described above, in the present exemplary embodiment, different references are used for the processing for a sound volume and the processing for a sound quality. Thus, it becomes possible to produce unprecedented sound expression and sound representation for which "the part to which it is desired to cause a player to pay attention through representation independently of a sound volume" is taken into consideration, in addition to a conventional expression.

[Details of Game Processing According to Present Exemplary Embodiment]

Next, with reference to FIG. 15 to FIG. 19, the game processing according to the present exemplary embodiment will be described in detail.

[Used Data]

Figure 15:
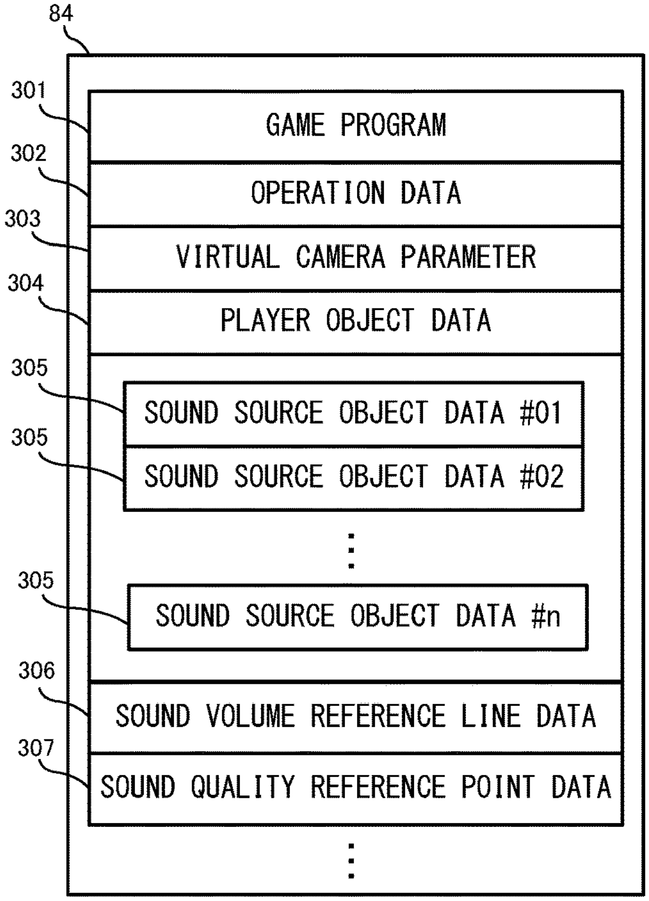
FIG. 15 is a memory map showing a non-limiting example of various data stored in a storage section 84 of the body apparatus 2.

First, various data used in this game processing will be described. FIG. 15 is a memory map showing an example of various data stored in the storage section 84 of the body apparatus 2. The storage section 84 of the body apparatus 2 stores a game program 301, operation data 302, a virtual camera parameter 303, player object data 304, sound source object data 305, a sound volume reference line data 306, sound quality reference point data 307, and the like.

The game program 301 is a program for executing the game processing according to the present exemplary embodiment.

The operation data 302 is data obtained from the left controller 3 and the right controller 4, and indicates the content of a player's operation. The operation data 302 includes data indicating whether or not each button of the controllers is pressed, data indicating the content of an operation to an analog stick, and the like.

The virtual camera parameter 303 includes various parameters used for virtual camera control, such as the position, the direction (imaging direction), the angle of view, and the gaze point of the virtual camera in the virtual space.

The player object data 304 is data relevant to the player object 101, and includes data indicating the outer appearance thereof, data indicating the present position of the player object in the virtual space, and the like.

Figure 16:
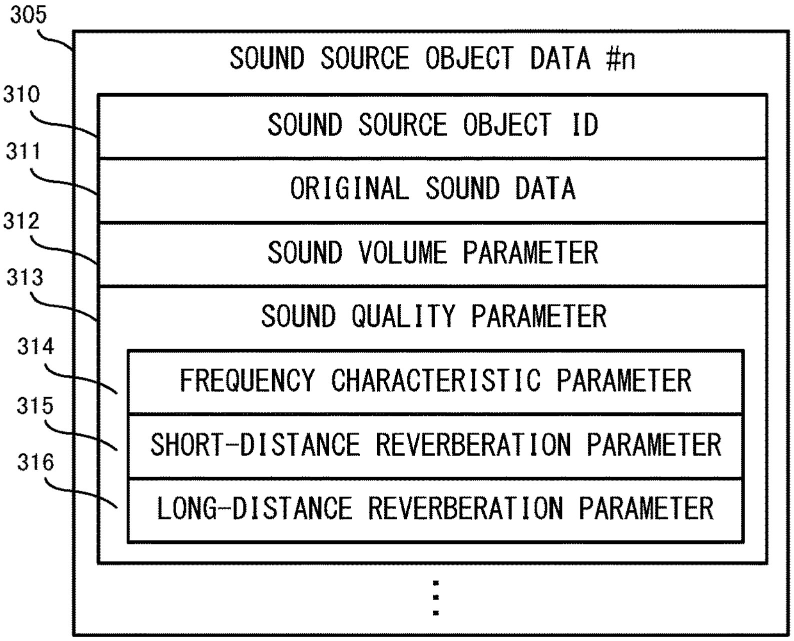
FIG. 16 shows a non-limiting example of the data configuration of sound source object data 305.

The sound source object data 305 is data relevant to the sound source objects 102, and a plurality of sound source object data 305 corresponding to the respective sound source objects are stored. In FIG. 15, sound source object data #n (n is an integer starting from 1) are indicated. Each sound source object data 305 includes data as shown in FIG. 16. FIG. 16 shows an example of the data configuration of each sound source object data 305. The sound source object data 305 includes a sound source object ID 310, original sound data 311, a sound volume parameter 312, a sound quality parameter 313, and the like. The sound source object ID 310 is an ID for uniquely identifying each sound source object. The original sound data 311 is data defining a sound to be produced by the sound source object. For example, if the sound source object is a "washing machine", sound data obtained by sampling an operation sound emitted from a washing machine is used. In other words, the original sound data 311 can be said as a sound associated with the sound source object. The sound volume parameter 312 is a parameter calculated on the basis of the sound volume distance described above, and indicates the sound volume of a sound to be produced by the sound source object. The sound quality parameter 313 is a parameter calculated on the basis of the sound quality distance. The sound quality parameter 313 includes a frequency characteristic parameter 314, a short-distance reverberation parameter 315, and a long-distance reverberation parameter 316 as described above. Besides, although not shown, data indicating the outer appearance of the sound source object, and the like are also included in the sound source object data 305.

Returning to FIG. 15, the sound volume reference line data 306 is data indicating the sound volume reference line 106 described above. The sound quality reference point data 307 is data indicating the sound quality reference point 108 described above.

[Details of Processing Executed by Processor 81]

Figure 18:
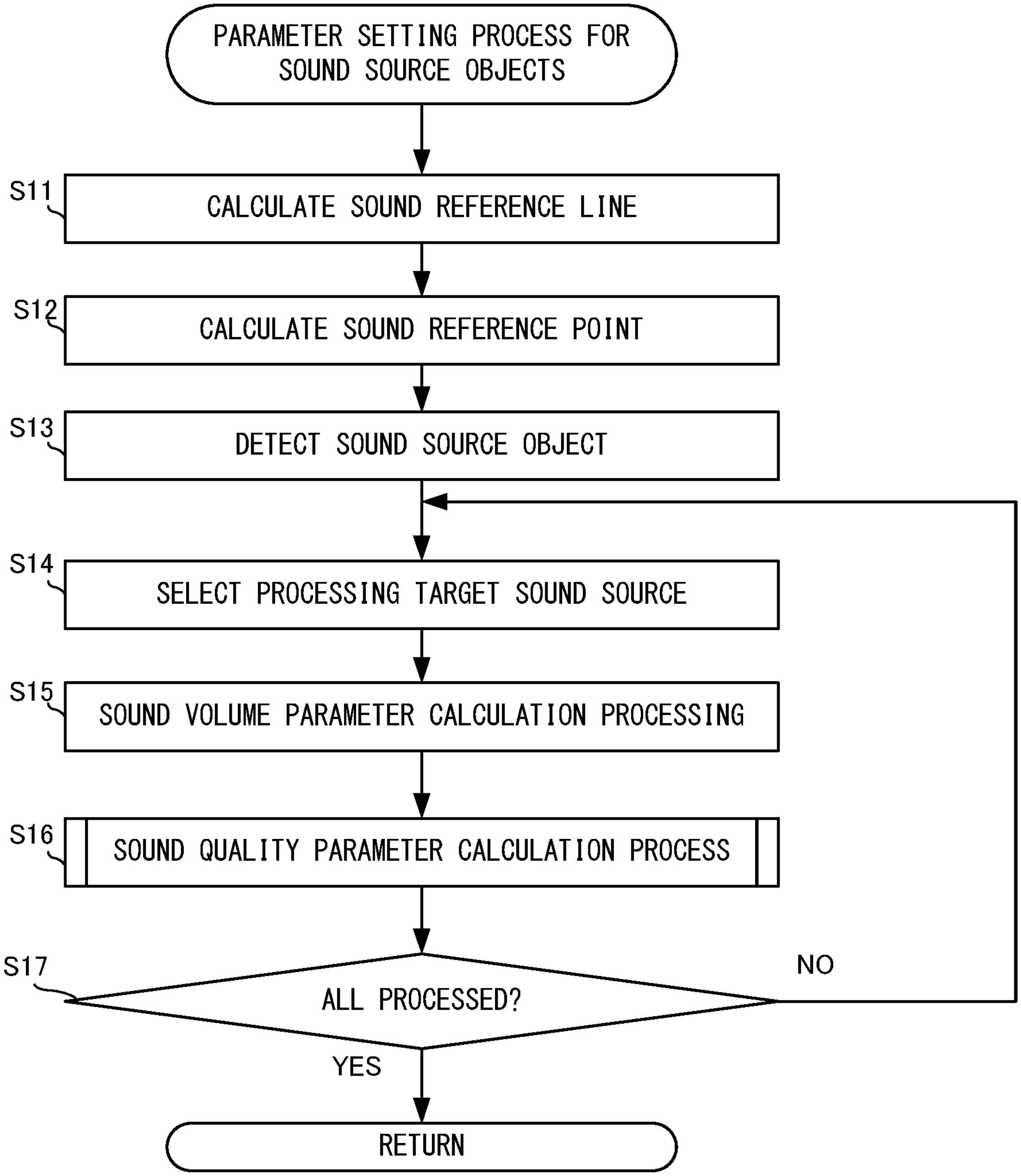
FIG. 18 is a flowchart showing the details of a parameter setting process for a sound source object.
Figure 19:
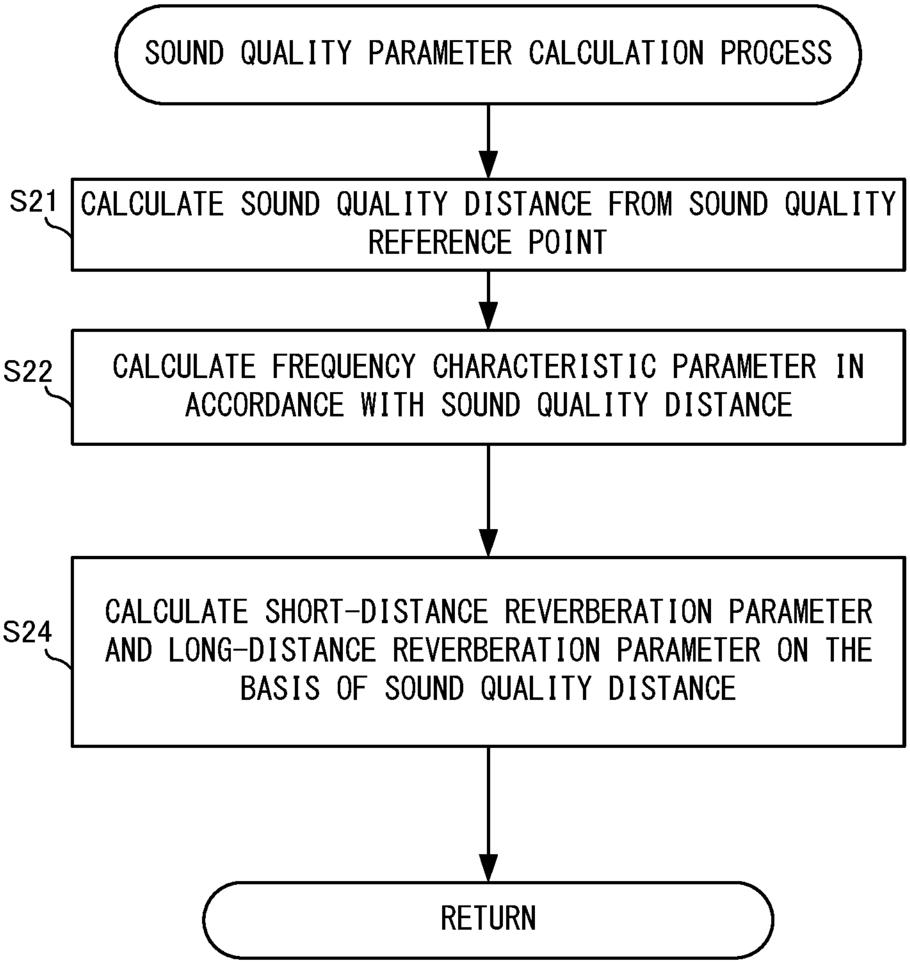
FIG. 19 is a flowchart showing the details of a sound quality parameter calculation process.

Next, with reference to flowcharts shown in FIG. 17 to FIG. 19, the details of the game processing according to the first exemplary embodiment will be described. In the following description, control relevant to a sound source object will be mainly described, and description of the other details of the game processing is omitted.

Figure 17:
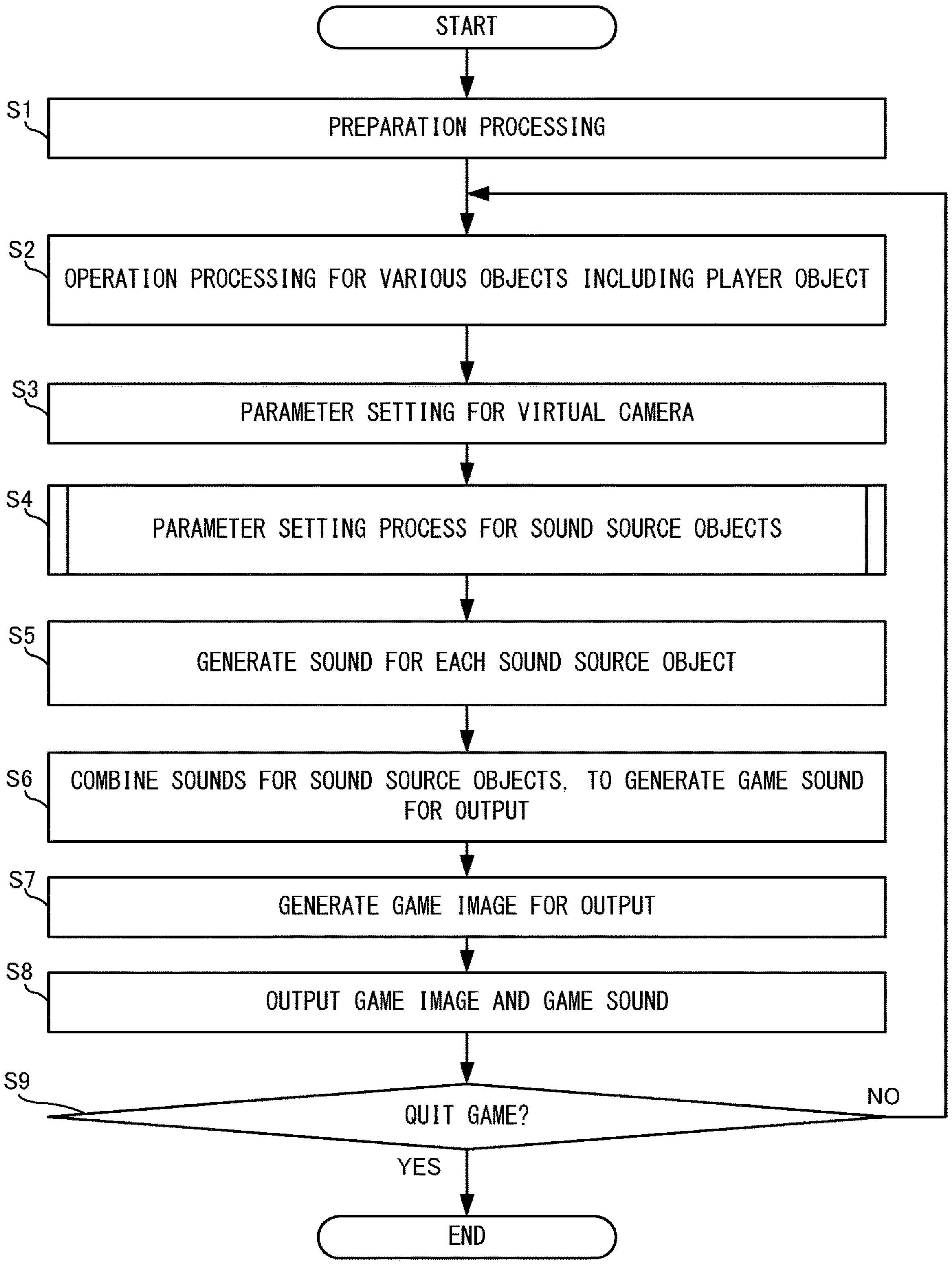
FIG. 17 is a flowchart showing the details of game processing according to an exemplary embodiment.

FIG. 17 is a flowchart showing the details of this game processing. First, in step S1, various preparation processes for starting the game are executed. Specifically, the processor 81 generates a virtual space on the basis of data stored in the storage section 84, and arranges various objects such as the player object 101 and the sound source objects 102, and the virtual camera, at positions set as their initial positions in the virtual space. Then, the virtual space is imaged by the virtual camera, to generate a game image, and the game image is outputted to the display 12. In addition, output of various sounds (BGM, various sound effects, etc.) in this initial arrangement state is also started.

Next, in step S2, operation processing for each of the objects including the player object 101 is executed. For the player object 101, processing of moving the player object or causing the player object to perform a predetermined operation is executed on the basis of the operation content indicated by the operation data 302. For the other objects, for example, if there is an object set to move autonomously, processing of moving the object as appropriate is executed.

Next, in step S3, processing of setting parameters for the virtual camera is executed. Specifically, on the basis of the position of the player object that has undergone the above processing in step S2, parameters such as the position, the direction, the angle of view, and the gaze point of the virtual camera are set, and are stored as the virtual camera parameter 303 in the storage section 84. In the present exemplary embodiment, the virtual camera is moved so as to follow the player object while keeping a certain distance from the player object, as an example. This means that the virtual camera moves along with the movement of the player object 101, and as a result, the positions of the sound volume reference line 106 and the sound quality reference point 108 can be also changed.

Next, in step S4, processing of setting parameters relevant to each sound source object is executed. That is, processing of setting parameters relevant to a sound volume and a sound quality for each sound source object is executed. FIG. 18 is a flowchart showing the details of a process for setting parameters for each sound source object. In FIG. 18, first, in step S11, processing of calculating the sound volume reference line 106 is executed. Specifically, the processor 81 calculates a line segment connecting the position of the virtual camera and the gaze point (in this example, the position of the player object 101) thereof at present is calculated, and data indicating the line segment is stored as the sound volume reference line data 306 in the storage section 84.

Next, in step S12, processing of calculating the sound quality reference point 108 is executed. In the present exemplary embodiment, the position of the gaze point is used as the sound quality reference point 108, and is stored as the sound quality reference point data 307 indicating the position of the sound quality reference point 108, in the storage section 84.

Next, in step S13, processing of detecting the sound source objects 102 present in the virtual space is executed. For example, processing of detecting the sound source objects 102 present within a predetermined range from the player object 101 or the virtual camera is executed. Next, in step S14, one sound source object 102 to be subjected to the processing in steps S15 and S16 described below is elected from among the detected sound source objects 102. That is, one sound source object 102 is selected from among the sound source objects 102 that have not been subjected to the processing in steps S15 and S16 yet. Hereinafter, the sound source object 102 selected here is referred to as processing target object.

Next, in step S15, processing of calculating the sound volume parameter indicating the sound volume for the processing target object is executed. Specifically, first, the sound volume distance that is the shortest distance between the processing target object and the sound volume reference line 106 is calculated. Next, the sound volume for the processing target object is calculated on the basis of the calculated sound volume distance. Then, the value indicating the calculated sound volume is stored as the sound volume parameter 312 in the storage section 84.

Next, in step S16, a sound quality parameter calculation process is executed. In this process, the frequency characteristic parameter and the reverberation parameter are calculated on the basis of the sound quality distance. FIG. 19 is a flowchart showing the details of the sound quality parameter calculation process. In FIG. 19, first, in step S21, the sound quality distance between the sound quality reference point 108 and the processing target object is calculated.

Next, in step S22, the frequency characteristic parameter is calculated in accordance with the calculated sound quality distance. That is, as described above with reference to FIG. 8 and FIG. 9, the reduction degree of the sound volume for a predetermined frequency component is calculated. In the present exemplary embodiment, the calculation is performed such that, the longer the sound quality distance is (i.e., the farther from the sound source), the greater the reduction degree is, whereas, the shorter the sound quality distance is (i.e., the closer to the sound source), the smaller the reduction degree is. For example, a predetermined function that enables such calculation may be used, or table data or the like in which such a relationship is defined may be used. Then, the value indicating the calculated reduction degree is stored as the frequency characteristic parameter 314 in the storage section 84.

Next, in step S24, processing of calculating the short-distance reverberation parameter 315 and the long-distance reverberation parameter 316 on the basis of the sound quality distance is executed. For example, using such a function that derives a result as shown by the graph in FIG. 14 above (or table data in which the contents of the graph are defined), the short-distance reverberation parameter 315 and the long-distance reverberation parameter 316 are calculated on the basis of the sound quality distance, and then stored in the storage section 84. Thus, the sound quality parameter calculation process is finished.

Returning to FIG. 18, next, in step S17, whether or not the processing in steps S15 and S16 has been done for all the detected sound source objects, is determined. If there is a sound source object that has not been subjected to the processing yet (NO in step S17), the process returns to step S14, to repeat the process. If all the sound source objects have been subjected to the processing (YES in step S17), the parameter setting process for the sound source objects is finished.

Returning to FIG. 17, next, in step S5, processing of generating a sound for each sound source object is executed on the basis of the various parameters calculated in step S4 above.

Next, in step S6, processing of combining the sounds for the respective sound source objects to generate a game sound for output, is executed.

Next, in step S7, processing of generating a game image for output is executed. Specifically, the virtual space is imaged by the virtual camera, thereby generating the game image for output.

In the game image generation processing in step S7, processing of setting the depth of field may be combined, depending on the content of the game. For example, image processing for displaying the game image such that an image at a position separated from the gaze point by a predetermined distance or longer in the game image is blurred, may be performed. Thus, the attention point (part to which it is desired to cause a player to pay attention) in the game image can be expressed in an easily understandable manner.

Next, in step S8, processing of outputting the game sound for output and the game image for output that have been generated in the above is executed. Then, in step S9, whether or not a condition for quitting the game is satisfied is determined. For example, whether or not a game quitting operation has been performed by a player is determined. As a result, if the game quitting condition is not satisfied (NO in step S9), the process returns to step S2, to repeat the process. If the game quitting condition is satisfied (YES in step S9), the game processing according to the present exemplary embodiment is ended.

As described above, in the present exemplary embodiment, the parameter relevant to the sound volume and the parameter relevant to the sound quality are calculated using respective different references. Thus, it becomes possible to produce unprecedented sound expression and sound representation for which "the part to which it is desired to cause a player to pay attention through representation independently of the sound volume" is taken into consideration. For example, in the case where a sound source is displayed in large size near the virtual camera but the sound thereof is of low importance in terms of game content, an out-of-focus sound expression can be made. On the other hand, for a sound to which it is desired to cause a player to pay attention, i.e., a sound of high importance, it is possible to enhance the attention degree of a player by expressing the sound relatively clearly.

In addition, for example, in game image processing, the following image expression is assumed: the depth of field is set so that an object to which it is desired to cause a player to pay attention is focused on in the image. In such a case, it is possible to make an expression in which the object is focused on also in terms of sound, and thus, intension of representation by an image and intension of representation by sound can be caused to coincide with each other.

Second Exemplary Embodiment

Next, the second exemplary embodiment will be described. In the first exemplary embodiment, the example in which the "line segment" referred to as sound volume reference line 106 is used as a reference for calculating the sound volume distance, has been shown. In the second exemplary embodiment, instead of such a line segment, a "point" is used as a reference for calculating the sound volume distance. The matters other than the reference for calculating the sound volume distance are the same as in the first exemplary embodiment.

Figure 20:
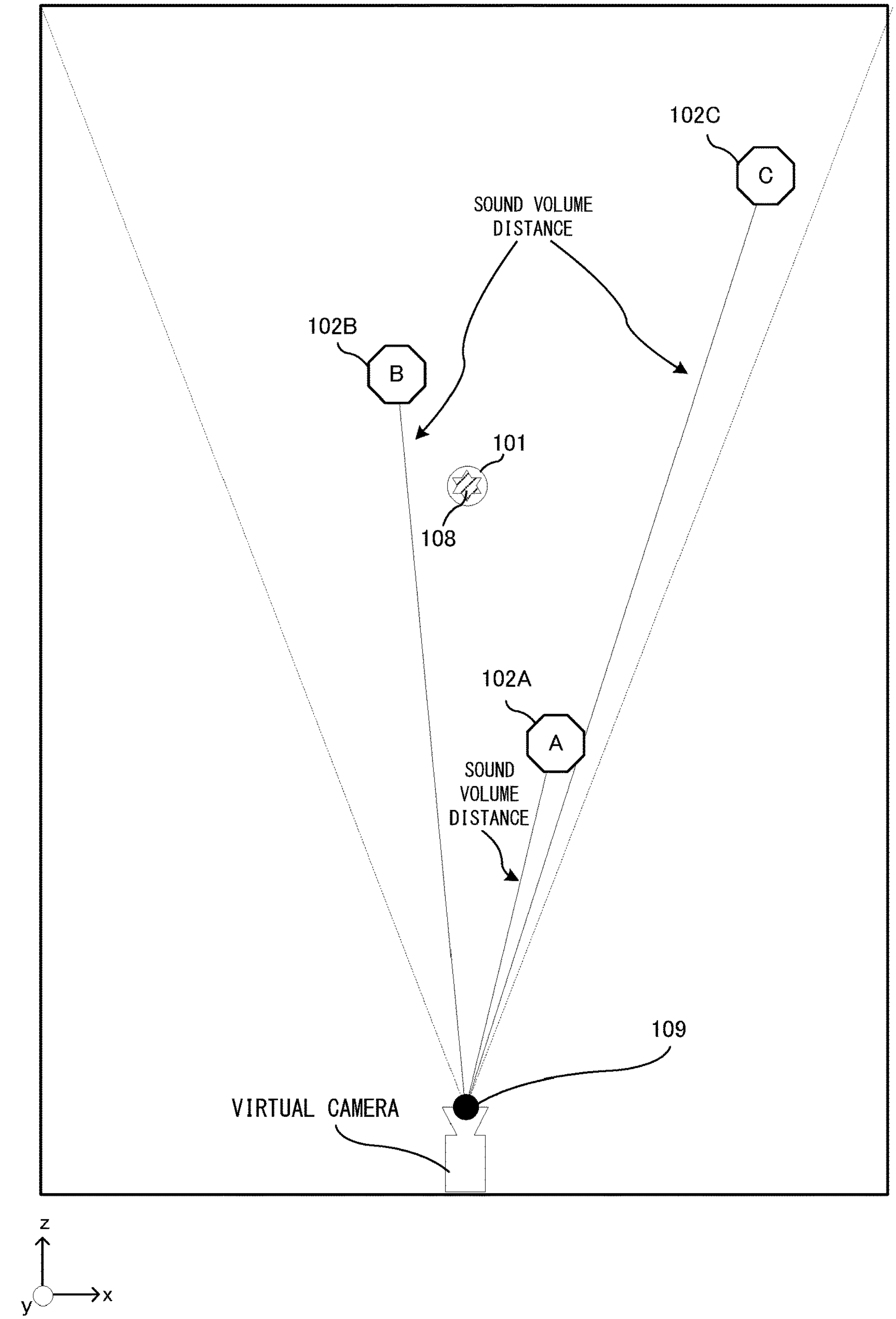
FIG. 20 illustrates a reference for a sound volume according to the second exemplary embodiment.

FIG. 20 illustrates a reference for calculating the sound volume distance according to the second exemplary embodiment. In FIG. 20, a sound volume reference point 109 is defined at the position of the virtual camera. In the second exemplary embodiment, the direct distance that is the shortest distance between the sound volume reference point 109 and each sound source object is used as the sound volume distance. In the case of using such a "point" position, it is possible to reduce a feeling of strangeness given to a player regarding a sound volume, in a first-person-view game in which the position of the virtual camera and the position (i.e., viewpoint) of the player object are the same, for example.

On the other hand, the sound quality reference point 108 is set at the position of the gaze point as in the first exemplary embodiment. Therefore, even though the reference for calculating the sound volume distance is set as a "point" position, this position is different from the position of the sound quality reference point 108, i.e., is a different reference. Therefore, as in the first exemplary embodiment, it is possible to change the attention degree for a sound by changing the sound quality, and thus, also in the second exemplary embodiment, it becomes possible to produce a sound expression for which "the part to which it is desired to cause a player to pay attention through representation independently of the sound volume" is taken into consideration.

In specific processing, data indicating the above sound volume reference point is used instead of the sound volume reference line data 306 in the first exemplary embodiment.

As described above, in the second exemplary embodiment, a "point" position is used as a reference for calculating the sound volume distance. Thus, in particular, in a first-person-view game, a feeling of strangeness regarding a sound volume is reduced, and as in the first exemplary embodiment, it is possible to change the attention degree of a player for a sound by changing the sound quality, whereby an unprecedented and new sound expression can be achieved.

Other Modifications

In the first exemplary embodiment, the sound volume reference line 106 is temporarily stored as the sound volume reference line data 306 in the storage section. In another exemplary embodiment, the sound volume reference line data 306 may not be used. For example, in the processing in step S15 in FIG. 18 above, the sound volume distance may be calculated at each time on the basis of the position of the processing target object, the position of the virtual camera, and the position of the gaze point. In this case, the processing in step S11 is not needed.

In the above exemplary embodiments, the example in which the sound quality reference point 108 is set at the position of the gaze point has been shown. However, the position of the sound quality reference point 108 may be moved during game processing. For example, while the gaze point and the sound quality reference point 108 are set to coincide with each other at the start of the game, only the sound quality reference point 108 may be moved to another position in the virtual space in accordance with the game progress thereafter or the like. For example, in FIG. 7, the position of the sound quality reference point 108 may be moved in a rightward upward direction in the drawing, i.e., brought close to the sound source object 102C. Other than this, the sound quality reference point 108 may be moved to the outside of the screen (outside the angle of view). Thus, it becomes possible to guide the player's line of sight by changing the attention point for sound quality. In particular, in virtual reality (VR) contents, the line of sight can be guided without losing immersion of the player.

Regarding the reverberation effect processing, in the above exemplary embodiments, two types of reverberation effect processing, i.e., processing for short-distance reverberation and processing for long-distance reverberation, are prepared, and the allocation ratio of sound volumes to be used for these is calculated as the reverberation parameters. In another exemplary embodiment, without using the allocation ratio, the processing may be gradually switched from short-distance reverberation to long-distance reverberation or from long-distance reverberation to short-distance reverberation, on the basis of the sound quality distance. That is, instead of processing of generating and combining a short-distance reverberation sound and a long-distance reverberation sound, processing of generating and outputting a single reverberation sound according to the sound quality distance may be performed.

In a game in which a view is switchable between a first-person view and a third-person view during game processing, for example, the reference for calculating the sound volume distance may be switched between the sound volume reference line 106 according to the first exemplary embodiment and the sound volume reference point 109 according to the second exemplary embodiment. Thus, it becomes possible to make a sound expression with a less feeling of strangeness, in accordance with change in the line of sight.

In the above exemplary embodiments, application to game processing in a game system has been shown as an example. However, without limitation to game processing, the processing as described above is applicable to various types of information processing in which sound control is performed in a virtual three-dimensional space. For example, such processing is also applicable to VR contents or the like not including game elements.

In the above exemplary embodiments, the case where a series of processing steps in game processing is executed by a single apparatus has been described. However, in another exemplary embodiment, the series of processing steps may be executed by an information processing system including a plurality of information processing apparatuses. For example, in an information processing system including a terminal-side apparatus and a server-side apparatus capable of communicating with the terminal-side apparatus via a network, a part of the series of processing steps may be executed by the server-side apparatus. In an information processing system including a terminal-side apparatus and a server-side apparatus capable of communicating with the terminal-side apparatus via a network, major processing of the series of processing steps may be executed by the server-side apparatus, and a part of the series of processing steps may be executed by the terminal-side apparatus. In such an information processing system, a server-side system may be composed of a plurality of information processing apparatuses, and processing to be executed on the server side may be executed by the plurality of information processing apparatus in a shared manner.

What is claimed is:

1. A non-transitory computer-readable storage medium having stored therein a sound processing program which, when executed, causes a computer of an information processing apparatus to at least:

dispose at least one virtual sound source in a virtual space captured by a virtual camera;

calculate a sound volume parameter based on a first distance between (i) the virtual sound source and (ii) a sound volume reference line extending from the virtual camera to a position of an object in the virtual space;

calculate a sound quality parameter based on a second distance between the virtual sound source and the position of the object; and output a sound associated with the virtual sound source, with a sound volume based on the sound volume parameter and a sound quality based on the sound quality parameter.

2. The non-transitory computer-readable storage medium according to claim 1, wherein the sound processing program further causes the computer to:

control the virtual camera in the virtual space.

3. The non-transitory computer-readable storage medium according to claim 2, wherein the position of the object corresponds to a gaze point of the virtual camera.

4. The non-transitory computer-readable storage medium according to claim 1, wherein the sound volume parameter is calculated such that, the shorter the first distance, the greater the sound volume is, and the longer the first distance, the smaller the sound volume.

5. The non-transitory computer-readable storage medium according to claim 1, wherein the sound quality parameter is a parameter indicating a degree of change of a frequency characteristic.

6. The non-transitory computer-readable storage medium according to claim 5, wherein the parameter indicating the degree of change of the frequency characteristic is a parameter for reducing a specific frequency component, and is calculated such that, the shorter the second distance, the smaller a degree of the reduction, and the longer the second distance, the greater the degree of the reduction.

7. The non-transitory computer-readable storage medium according to claim 1, wherein the sound quality parameter is a parameter corresponding to a reverberation effect.

8. The non-transitory computer-readable storage medium according to claim 7, wherein the parameter relevant to the reverberation effect is calculated such that, the shorter the second distance, the greater a time lag between a direct sound and an indirect sound, and the longer the second distance, the smaller the time lag.

9. The non-transitory computer-readable storage medium according to claim 1, wherein the first distance corresponds to a shortest direct distance.

10. An information processing apparatus, comprising a processor configured to at least:

dispose at least one virtual sound source in a virtual space captured by a virtual camera;

calculate a sound volume parameter based on a first distance between (i) the virtual space to the virtual sound source and (ii) a sound volume reference line extending from the virtual camera to a position of an object in the virtual space;

calculate a sound quality parameter based on a second distance between the virtual space to the virtual sound source and the position of the object; and output a sound associated with the virtual sound source, with a sound volume based on the sound volume parameter and a sound quality based on the sound quality parameter.

11. The information processing apparatus according to claim 10, wherein the processor is configured to:

control the virtual camera in the virtual space.

12. The information processing apparatus according to claim 11, wherein the position of the object corresponds to a gaze point of the virtual camera.

13. The information processing apparatus according to claim 10, wherein the sound volume parameter is calculated such that, the shorter the first distance, the greater the sound volume, and the longer the first distance, the smaller the sound volume.

14. The information processing apparatus according to claim 10, wherein the sound quality parameter is a parameter indicating a degree of change of a frequency characteristic.

15. The information processing apparatus according to claim 14, wherein the parameter indicating the degree of change of the frequency characteristic is a parameter for reducing a specific frequency component, and is calculated such that, the shorter the second distance, the smaller a degree of the reduction, and the longer the second distance, the greater the degree of the reduction.

16. The information processing apparatus according to claim 10, wherein the sound quality parameter is a parameter corresponding to a reverberation effect.

17. The information processing apparatus according to claim 16, wherein the parameter relevant to the reverberation effect is calculated such that, the shorter the second distance, the greater a time lag between a direct sound and an indirect sound, and the longer the second distance, the smaller the time lag.

18. The information processing apparatus according to claim 10, wherein the first distance corresponds to a shortest direct distance.

19. A sound processing method to be executed by a computer that controls an information processing apparatus, the method comprising:

disposing at least one virtual sound source in a virtual space captured by a virtual camera;

calculating a sound volume parameter based on a first distance between (i) the virtual sound source and (ii) a sound volume reference line extending from the virtual camera to a position of an object in the virtual space;

calculating a sound quality parameter based on a second distance between the virtual sound source and the position of the object; and outputting a sound associated with the virtual sound source, with a sound volume based on the sound volume parameter and a sound quality based on the sound quality parameter.

20. The method according to claim 19, wherein the first distance corresponds to a shortest direct distance.

21. An information processing system, comprising:

a speaker; and a processor configured to at least:

dispose at least one virtual sound source in a virtual space captured by a virtual camera;

calculate a sound volume parameter based on a first distance between (i) the virtual space to the virtual sound source and (ii) a sound volume reference line extending from the virtual camera to a position of an object in the virtual space;

calculate a sound quality parameter based on a second distance between the virtual sound source and the position of the object; and output to the speaker a sound associated with the virtual sound source, with a sound volume based on the sound volume parameter relevant and a sound quality based on the sound quality parameter.

22. The information processing system according to claim 21, wherein the first distance corresponds to a shortest direct distance.

* * * * *